United States Patent [19]
Rohrs et al.

[11] Patent Number: 5,575,176
[45] Date of Patent: Nov. 19, 1996

[54] THREE-DIMENSIONAL POSITIONING DEVICE

[76] Inventors: Henry W. Rohrs, 1106 Anthrop Dr., West Lafayette, Ind. 47906; David Berry, 8906 Marathon Rd., Longmont, Colo. 80503

[21] Appl. No.: 367,845

[22] Filed: Dec. 30, 1994

[51] Int. Cl.[6] ............................. B25J 1/08; F16J 15/50
[52] U.S. Cl. .................... 74/479.01; 74/571 M; 414/217; 269/71
[58] Field of Search ................... 74/479.01, 571 M, 74/86; 414/217, 222, 939; 366/139, 288, 297; 118/730; 156/345 V, 345 P; 204/298.27, 298.28; 269/71

[56] References Cited

U.S. PATENT DOCUMENTS

| | | | |
|---|---|---|---|
| 4,014,439 | 3/1977 | Kochsiek et al. | 269/71 X |
| 4,030,615 | 6/1977 | Guggi et al. | 214/1 |
| 4,749,898 | 6/1988 | Suzuki et al. | 74/571 M X |
| 4,750,360 | 6/1988 | Smith | 74/571 M X |
| 4,781,520 | 11/1988 | Balter | 74/479.01 X |
| 4,797,053 | 1/1989 | Balter | 414/749 |
| 4,850,779 | 7/1989 | Cashell et al. | 414/3 |
| 4,885,946 | 12/1989 | Balter | 74/18.1 |
| 4,885,947 | 12/1989 | Balter | 74/18.1 |
| 5,105,932 | 4/1992 | Bryson et al. | 198/619 |
| 5,156,820 | 10/1992 | Wong et al. | 118/730 X |
| 5,223,001 | 6/1993 | Saeki | 414/217 X |
| 5,429,345 | 7/1995 | Yang | 269/71 |

FOREIGN PATENT DOCUMENTS

| | | | |
|---|---|---|---|
| 1123420 | 5/1989 | Japan | 414/939 |

*Primary Examiner*—Charles A. Marmor
*Assistant Examiner*—Troy Grabow
*Attorney, Agent, or Firm*—Greenlee, Winner and Sullivan, P.C.

[57] ABSTRACT

This invention provides an apparatus or manipulator for positioning objects within a sealed chamber. The inventive positioning apparatus has a stator (or sleeve) sized and shaped for receiving a substantially cylindrical outer rotatable element. The outer element is rotatable with respect to the stator. The outer element has an eccentrically bored longitudinal passage sized and shaped for receiving an inner rotatable element. The inner and outer rotatable elements are independently rotatable with respect to each other. The object to be positioned in the sealed chamber is eccentrically mounted on the internal end face of the inner element such that relative rotation of the inner and outer element translates the mounted object in an X-Y plane perpendicular to the axis of the outer element. Relative rotation of the inner and outer elements allows two-dimensional object positioning. The inner element or outer element or both can be linearly translated along their axes to provide a third dimension of positioning parallel to the axes (Z-direction). Optionally, the object is mounted on a rod within an eccentrically bored passage in the inner element to allow rotation of the object independent of X-Y-Z positioning. The positioning apparatus is adapted for mounting onto a chamber and forming a seal or seals with the chamber to isolate it from the external atmosphere and maintain the internal atmosphere. The inventive positioning device is adaptable to manual, magnetic or motor-driven operation.

17 Claims, 8 Drawing Sheets

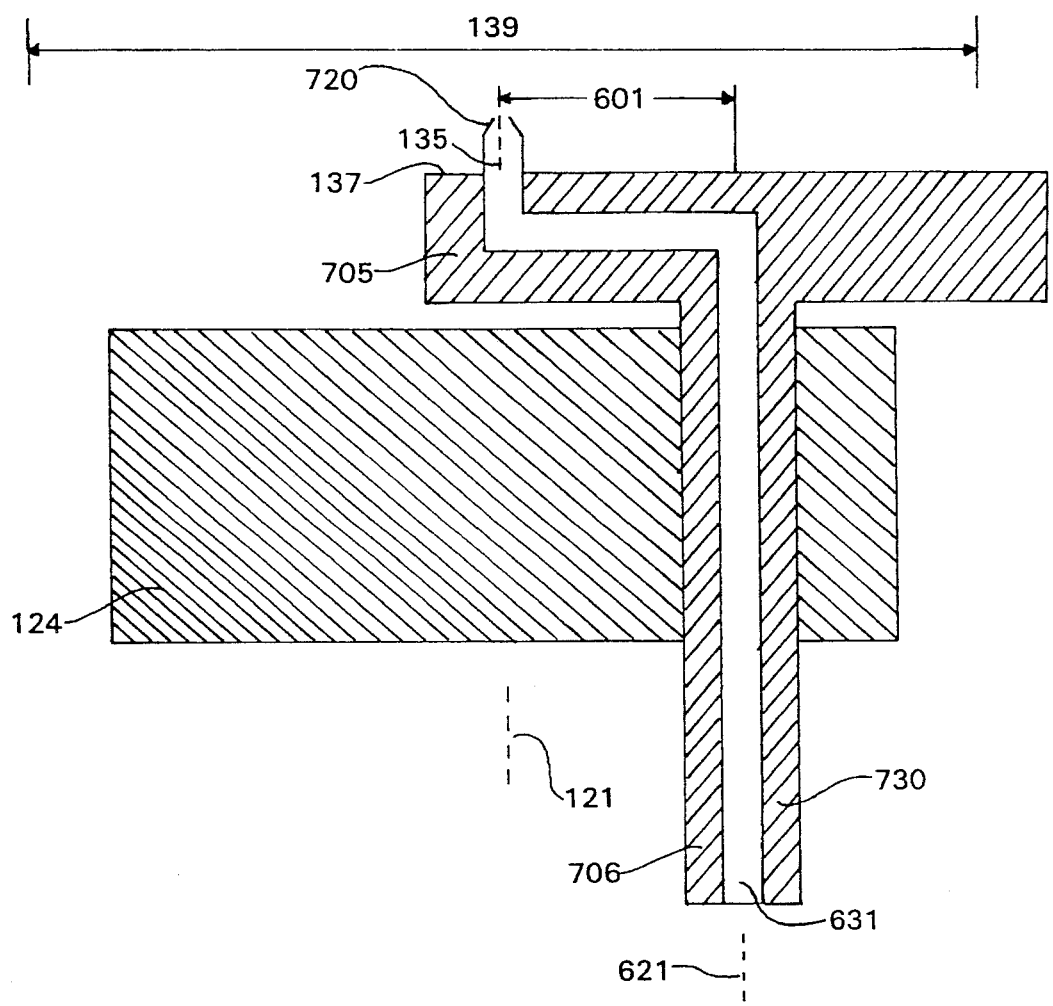
FIGURE 7A
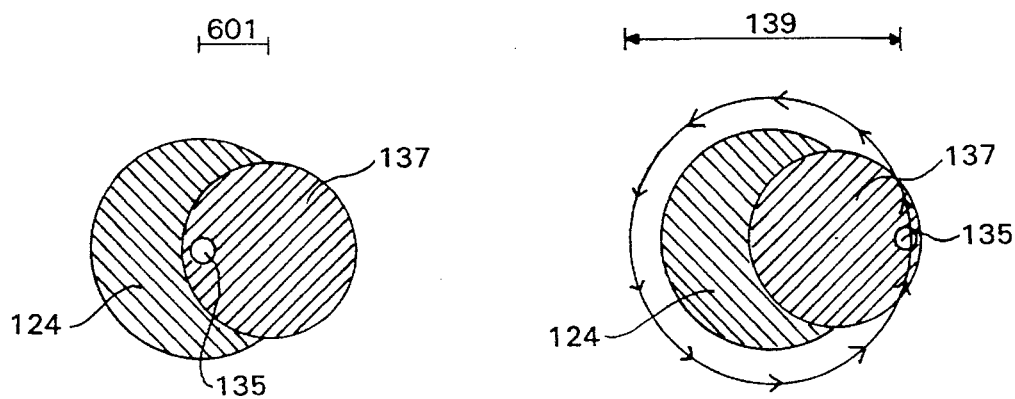
FIGURE 7B  FIGURE 7C

THREE-DIMENSIONAL POSITIONING DEVICE

This invention was made at least in part under National Science Foundation Grant CHE-9215164. The United States government has certain rights in this invention.

FIELD OF THE INVENTION

This invention relates to mechanical positioning devices, also called manipulators, for positioning of objects within a sealed chamber or space, which are remotely operable from the G outside of that sealed chamber or space. Precision positioning of the object within the chamber is achieved by relative rotation and linear translation of manipulator elements.

BACKGROUND OF THE INVENTION

Many industrial, research and analytical applications require the use of sealed chambers having controlled atmospheres, e.g. dry or inert atmosphere (i.e., Ar or the like) chambers, high or ultra-high vacuum chambers, chambers held above ambient pressure, dust-free environments and protective chambers such as those used in certain biological research. Vacuum applications include among others sputtering, vapor deposition, plasma etching and ion implantation processes requiring remote positioning, movement or rotation of samples within a vacuum chamber. Applications in scientific research include among others those requiring the positioning of electron, ion or atom sources or nozzles with respect to each other, light sources, detectors, or similar devices within a vacuum chamber. In such applications, it is desirable to position, move or rotate objects within the chamber without opening the chamber thereby compromising its internal atmosphere. To meet these needs positioning devices or manipulators remotely operable from outside the chamber have been developed.

U.S. Pat. No. 4,885,946 discloses a mechanism for feed through of rotary and/or linear motion to a sealed chamber. The feed through mechanism includes coaxial shafts, one held within an opening through the other, which in one embodiment can each carry a sample and rotate simultaneously at different speeds and in opposite directions. In an alternate embodiment, the mechanism can be adapted to rotate a sample and position it within the chamber in one-dimension along the shaft axis. This feed through mechanism relies upon the use of flexible bellows to maintain seals therein to the sealed chamber. U.S. Pat. No. 4,885,947 describes another rotary motion feed through device.

U.S. Pat. No. 5,105,932 discloses a precision magnetically operated manipulator which allows independent sample rotation and single-dimension positioning of the sample by linear motion. The disclosed manipulator comprises a rotatable cylindrical center rod carrying a sample or target supported within a square, linear shaft which is itself supported within a housing. Rotation of the center rod, which is coaxial with the square shaft, with respect to that shaft rotates the sample. Linear translation of the square shaft within its housing positions the sample in a single dimension (coaxially with the shaft) within the chamber. The support housing, square shaft and rod are enclosed in a sealed housing mountable on a vacuum chamber and are all then placed under vacuum. Two magnet carriage systems, one for rotation and the other for translation, positioned outside of the sealed housing, are employed to rotate and position the sample from outside the vacuum chamber.

U.S. Pat. No. 4,850,779 discloses a remotely operable manipulator which carries a rotatable object-holder, i.e., gripping jaws, mounted on a shaft and operated by a sleeve mechanism. Flexible metal bellows sealing units permit axial and lateral movement of the shaft and sleeve to change the position of the object-holder in the chamber.

U.S. Pat. Nos. 4,030,615 and 4,497,053 also disclose manipulators for movement of objects in a sealed chamber. The bellows-type manipulator of U.S. Pat. No. 4,030,615 allows linear displacement, turning and pivoting in three-dimensions of a sample mounted on a manipulating bar. Displacement is conveyed to the manipulating bar by means of an external moveable guide via a ball joint. A flexible bellows mechanism provides a seal to the external atmosphere while allowing motion of the external guide. In U.S. Pat. No. 4,497,053, an externally operable rotary drive mechanism coupled to two internal perpendicular guided slides allows rotation and two-dimensional positioning of a sample mounted on one of the slides.

The present invention provides new remotely operable manipulators that allow three-dimensional positioning of a object and object rotation, if desired, in a sealed chamber. The inventive manipulator design allows accurate object positioning, is simple, inexpensive, rugged and low-maintenance and precludes the need for expensive, thin-walled and failure-prone bellows seals to achieve three-dimensional positioning. The new design is versatile, can be constructed in a variety of sizes and is readily adaptable for manual, magnetic or motor-driven operation.

SUMMARY OF THE INVENTION

This invention provides compound X-Y polar coordinate translators which can be used to position objects within sealed chambers. These positioning apparatuses or manipulators allow insertion and positioning of an object within the sealed chamber but can be operated remotely from outside of the chamber.

The inventive positioning apparatus has a stator (or sleeve) sized and shaped for receiving a substantially cylindrical outer rotatable element. The outer element is rotatable with respect to the stator. The outer element has an eccentrically bored longitudinal passage sized and shaped for receiving an inner rotatable element. The inner and outer rotatable elements are independently rotatable with respect to each other. The object to be positioned in the sealed chamber is eccentrically mounted (i.e., offset from the inner element axis) on the internal end face of the inner and outer element such that relative rotation of the inner and outer element translates the mounted object in an X-Y plane perpendicular to the axis of the outer element. Relative rotation of the inner and outer elements allows two-dimensional object positioning.

The inner element or outer element or both can be linearly translated along their axes to provide a third dimension of positioning parallel to the axes (Z-direction). Preferably, only one of the elements can be translated and more preferably the inner element can be independently translated and rotated.

Preferably the object is mounted on the internal end face of the inner element at a point such that it can be moved by rotation of the inner element to be coaxial with the outer element. Mounting in this position allows object positioning in a full circle in the X-Y plane.

The positioning apparatus is adapted for mounting onto a chamber and has a means for forming a seal or seals with the chamber to isolate it from the external atmosphere and maintain the internal atmosphere. This seal can comprise seals between the interfaces of the inner element, the outer element and the stator. Alternately, the entire manipulator may be enclosed in a sealed housing. The manipulator is mounted on the chamber such that the internal end faces of the inner and outer elements communicate with the inside of the chamber to allow object positioning within the chamber.

The relative rotation of the inner and outer elements also causes rotation of the mounted object. To allow a desired object orientation to be maintained during object positioning, the object is coaxially mounted on a rotatable rod which is inserted into an eccentrically bored passage through the inner element sized and shaped for receiving the rod. Preferably, the eccentric passage in the inner element is positioned such that a rod-mounted object can be moved by rotation of the inner element to be coaxial with the outer element. The rod is independently rotatable with respect to the inner and outer elements. The rod can also optionally be translated along the axis of the passage to provide additional Z-dimensional motion. If necessary, the interface between the rod and the inner element can be provided with seals appropriate to maintain the internal atmosphere of the chamber. Inclusion of the rotatable rod allows the object to be rotated and positioned in a three-dimensional space in the chamber.

The interfaces between the inner element, the outer element, the stator and the optional rotatable rod are preferably provided with bearing and/or bushing devices to facilitate smooth rotation and/or translation.

An alternate positioning apparatus which allows a larger X-Y field for positioning has an inner element with two portions: a rotatable cylindrical shaft positioned and rotatable within the eccentric passage of the outer element and a head portion upon which the object is mounted. In this embodiment the outer element passage is offset from the axis of the outer element preferably by more than one-half the radius of the outer element. The head of the inner element is then sized and shaped such that a mounted object can be positioned at a distance radially outward from the outer element axis greater than the radius of the outer element.

The positioning apparatuses of this invention can be readily and routinely adapted to be operated for independent rotation and/or translation of elements and rods by any means known in the art and particularly manually, magnetically and or by motor-driven means.

Other features and advantages of the manipulators of this invention will be apparent on consideration of the following drawings and descriptions.

BRIEF DESCRIPTION OF THE DRAWINGS

FIG. 4A is an exploded perspective view of the manipulator of FIG. 3. FIG. 4B is a view of the internal end of the manipulator of FIG. 3 showing the relative positions of the axes of the manipulator elements.

FIG. 5A indicates the position of the X and Y reference axes. FIG. 5B illustrates the initial position (X=Y=0) with the mounted object aligned coaxially with the axis of the outer element with angles $\phi=0$ and $\beta=180°$. FIG. 5C illustrates a position with maximum Y displacement (2d) at X=0 with $\phi=\beta=90°$. FIG. 5D illustrates a position with maximum X displacement (2d) at Y=0 with $\phi=\beta=0$. FIG. 5E illustrates an intermediate position with $\phi=45°$ and $\beta=45°$ with X=Y=1.414d. FIG. 5F illustrates the possible travel of the object in the X-Y plane: a circle coaxial with the outer element with a radius of 2d.

FIGS. 7A–C illustrate an alternate configuration of inner and outer rotating elements allowing object positioning within a X-Y plane circle with radius larger than that of the outer element. FIG. 7A is a cross-sectional view of the inner and outer rotating elements. FIG. 7B is a view of the end face of the manipulator of FIG. 7A with the object holder positioned in the initial position coaxial with the outer element. FIG. 7C is another view of the internal end face of the manipulator of FIG. 7A with the object holder positioned by rotation of the inner element at the furthest point from the manipulator axis. The circle marked with "<" indicates the extent of X-Y travel of the object.

DETAILED DESCRIPTION OF THE INVENTION

Figure 1:
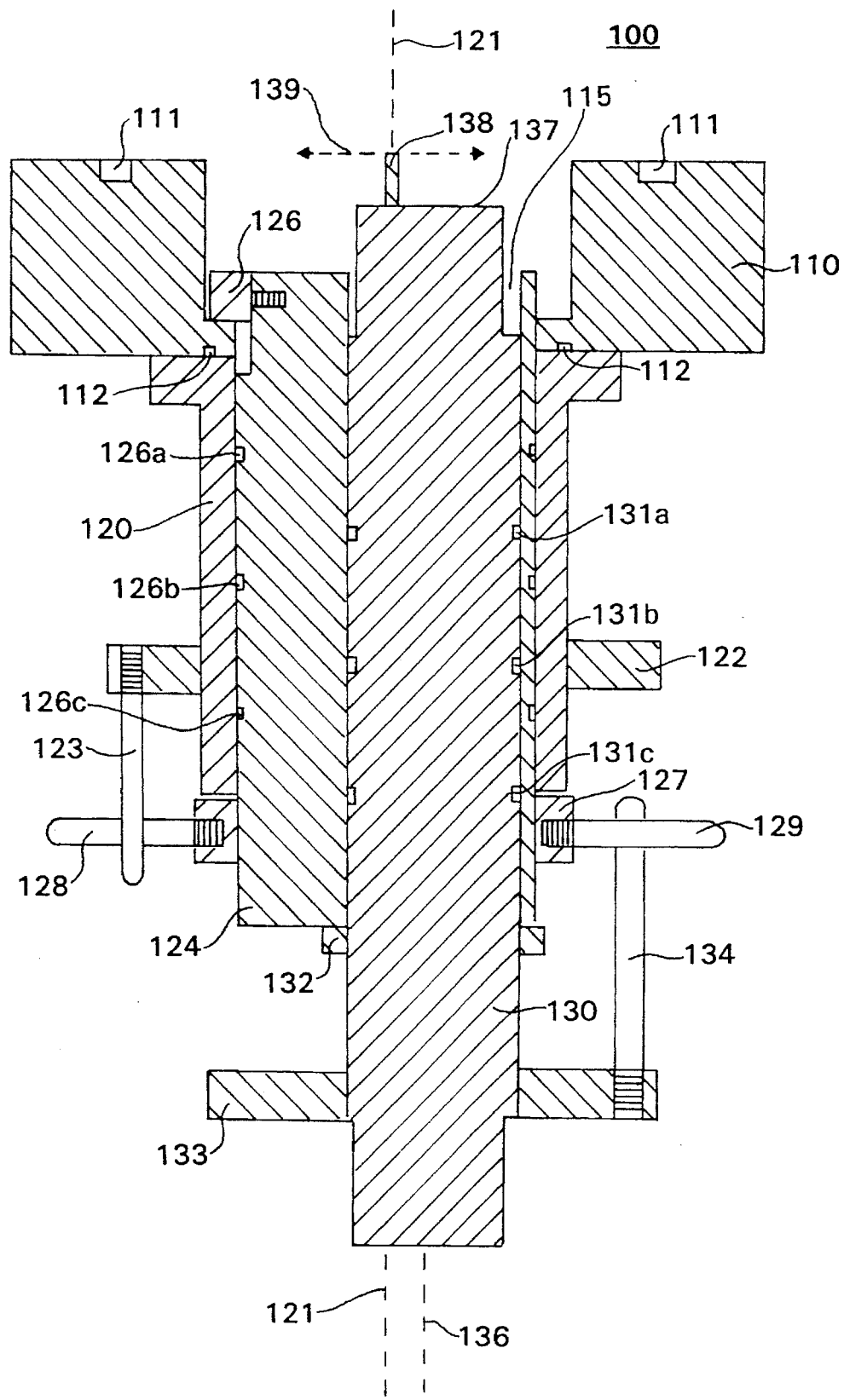
FIG. 1 is a cross-sectional view of a manipulator of this invention adapted for attachment to a vacuum chamber with manual rotation (X-Y plane positioning) and Z-translation.

FIG. 1 is a cross-sectional view of a manipulator of this invention for positioning an object within a sealed chamber. The apparatus has a stator or sleeve 120 attached to flange 110, for example using bolts (not shown) with and o-ring inserted in groove 112 when necessary to form a seal. Flange 110 is adapted for mounting on a chamber, for example a vacuum chamber, employing bolts (not shown) and an o-ring in groove 111. Outer rotating element 124 is substantially cylindrical and has an eccentrically bored passage 115 through its length for receiving a substantially cylindrical inner rotating element 130. The outer element has o-ring grooves 126a–b around its circumference for receiving o-rings to form a seal between the outer element 124 and stator 120. The inner element also has o-ring grooves 131a–c around its circumference for receiving o-rings to form a seal between the shaft of the outer element and the inner element. The inner element has an end face 137 on which the object (138) to be positioned is mounted at 135. The internal end face with mounted object communicates with the inside of the sealed chamber.

The object is mounted off axis on the inner element. Preferably the relative sizes of the inner and outer elements are such that, in an initial rotational orientation of the inner and outer elements, the object is mounted coaxially with the outer element. The axis of the outer element is shown as 121, that of the inner element is 136. The distance between the axis of the inner element and the center of the mounting site is d.

The stator and outer element are rotatable with respect to each other and the inner and outer element are rotatable with respect to each other. In addition, the inner element can be translated along its length with respect to the outer element. As shown in detail below, rotation of the inner and outer elements allows positioning of the object within a circle of diameter 139 (4d) perpendicular to and symmetrical with respect to axis 121. Translation of the inner element coupled with relative rotation of the elements allows positioning of the object within a cylinder of diameter 139 along the axis 121. The outer element can optionally be translated along its length with respect to the stator, but preferably is not translated.

The manipulator of FIG. 1 is shown adapted for manual rotation by turning of elements 130 and 124 and manual translation by moving element 130 linearly in the passage 115 of the outer element 124. The manipulator shown is optionally provided with safety stop 126 to prevent expulsion of the outer element and an adjustable ring stop 127 to limit inward translation of the outer element. Similarly, optional adjustable ring stop 132 (attached to inner element 130) limits inward translation of the inner element. The manipulator can also be provided, if desired, with reference pins 123,128, 129 and 134. These removable pins are mounted on adjustable rings and allow reproducible selection of particular positions of relative orientation of the inner and outer elements as a starting point for rotation for X-Y positioning of the object. FIG. 1 illustrates selection of an initial position with the mounted object coaxial with the manipulator.

In FIG. 1, the stator and flange are shown as two elements, alternately the stator can be machined with a flange end for mounting on a chamber. Any means known in the art for forming a seal appropriate to maintain the internal atmosphere in the chamber can be employed in mounting the manipulator to the chamber.

The inner and outer elements in FIG. 1 are shown as solid elements. Alternatively, both of these elements can be hollow or machined with passageways to introduce gases or liquids into the system or to apply vacuum. Any adaptation of the elements must maintain the integrity of the internal atmosphere and allow rotation and translation of the elements.

Figure 2:
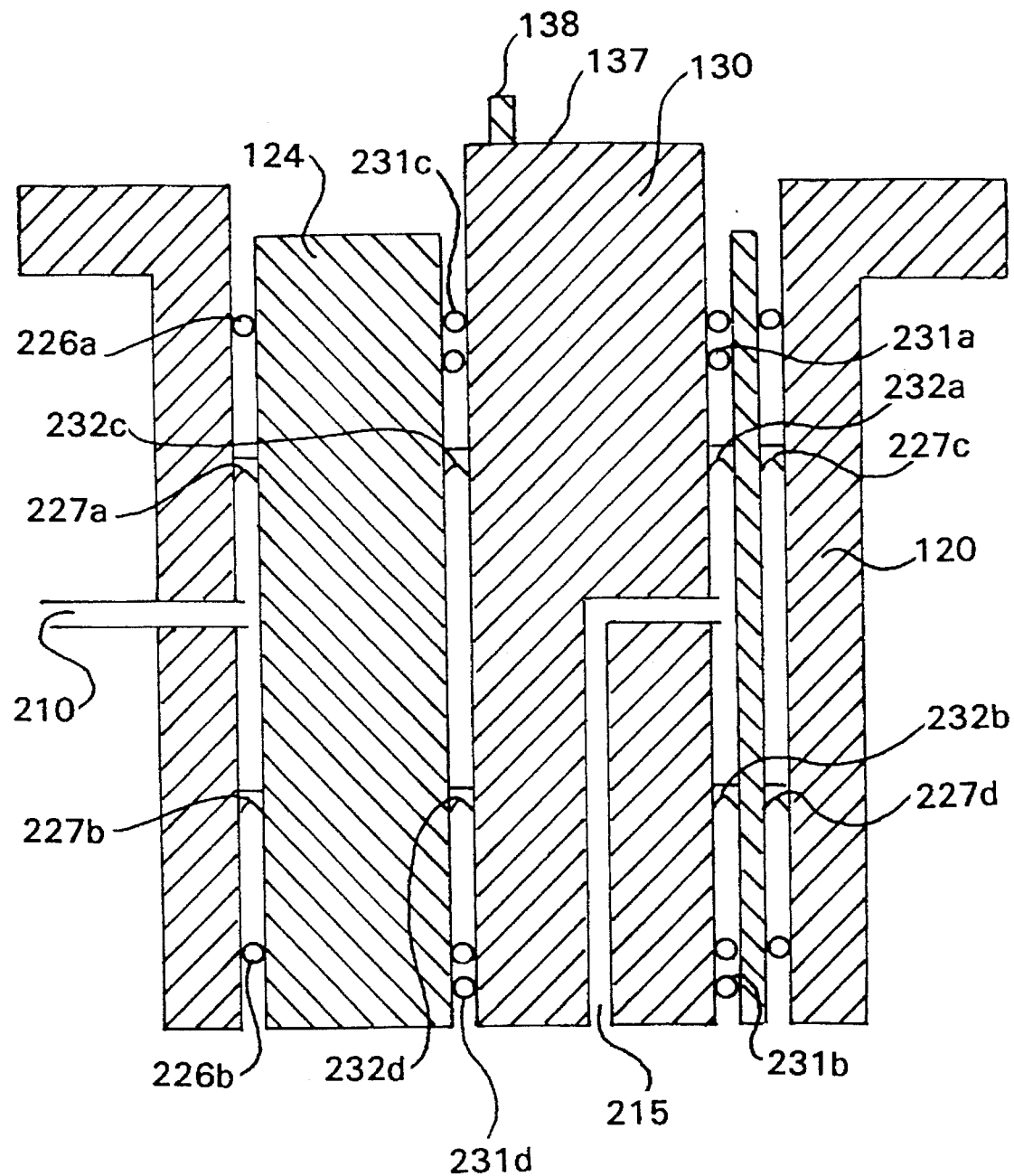
FIG. 2 is a cross-sectional view of an alternate manipulator of this invention.

FIG. 2 schematically illustrates an alternate manipulator modified from that of FIG. 1 to provide for smoother rotation and translation of inner and outer elements. The manipulator of FIG. 2 is also shown adapted for ultra-high vacuum operation. o-rings are replaced with low friction seals 227a–d and 232a–d in FIG. 3. Bearings and/or bushings 226a–d are introduced between the stator 120 and the outer element 124 to facilitate rotation of element 124 in the stator. Bearings and/or bushings 231a–d are introduced between the inner element 124 and the outer element 130 to facilitate rotation and longitudinal translation. To facilitate ultra-high vacuum operation, means for applying a vacuum, via conduits 210 and 215, to the space between the seals is provided.

Those of ordinary skill in the art will appreciate that a variety of means, other than those specifically illustrated, for providing for smooth rotation and linear motion are available in the art. This invention encompasses any such means readily adaptable to relative rotation and translation of cylindrical elements.

Figure 3:
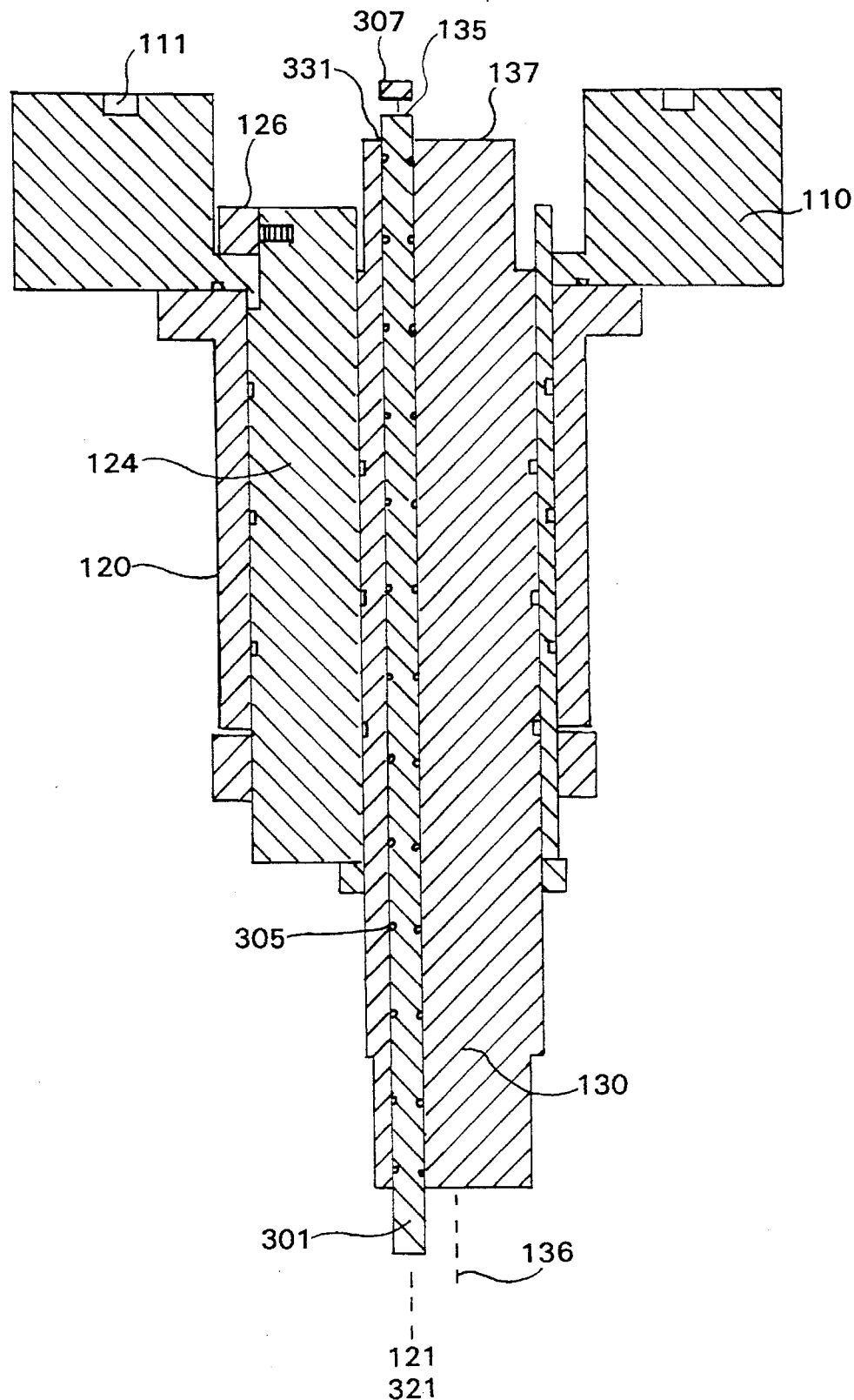
FIG. 3 is a cross-sectional view of another alternate manipulator of this invention having a object-carrying rod rotatable within the inner element.

Relative rotation of the inner and outer elements of the manipulators of FIGS. 1 and 2 to position the object also results in rotation of the orientation of the object. In many applications, for example for delivery of gases or liquids through a symmetrical nozzle or similar source, the orientation of the object is not critical. In other applications, for example in positioning of samples or targets or unsymmetrical objects, the rotational orientation of the object within the chamber may be important. Further, an application may require sample rotation during sample analysis or deposition, etching or related sample processing. FIG. 3 illustrates another alternate manipulator of this invention having a third rotatable element, for example rod 301, which allows rotation of the object independently of the relative rotations of the inner and outer elements of the manipulator. In this embodiment, inner element 130, has a passage 331 through its length sized and shaped to receive and allow rotation of rod 301 with axis 321. The passage is centered at mounting site 135. A sample holder (307) is illustrated mounted on rod 301. In the initial position with the object aligned coaxially, as shown, rotation of rod 301 rotates the object with respect to the manipulator axis. Rod 301 can optionally be adapted to move axially within the passage to provide Z-translation. Appropriate seals, if necessary, and/or bearings or bushings (305) for smooth rotation and/or translation are provided between rod 301 and the inner element.

Figure 4A:
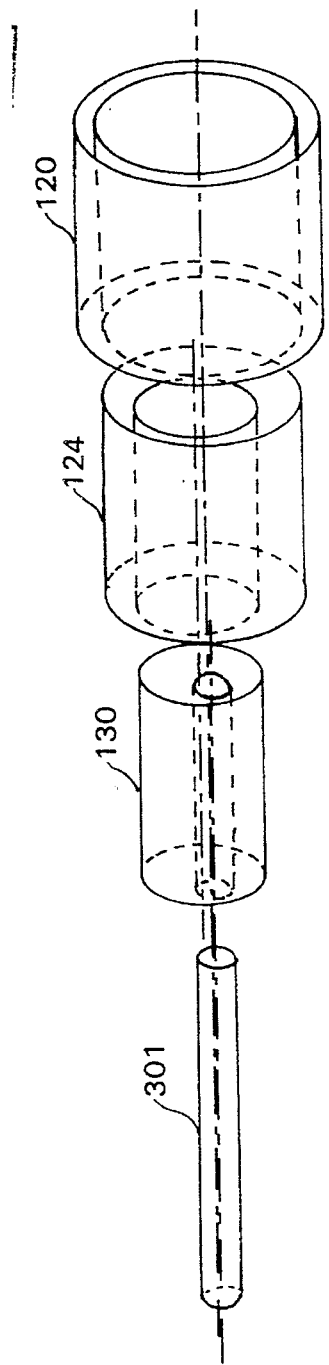
FIG. 4A-B further illustrate the manipulator of FIG. 3.
Figure 4B:
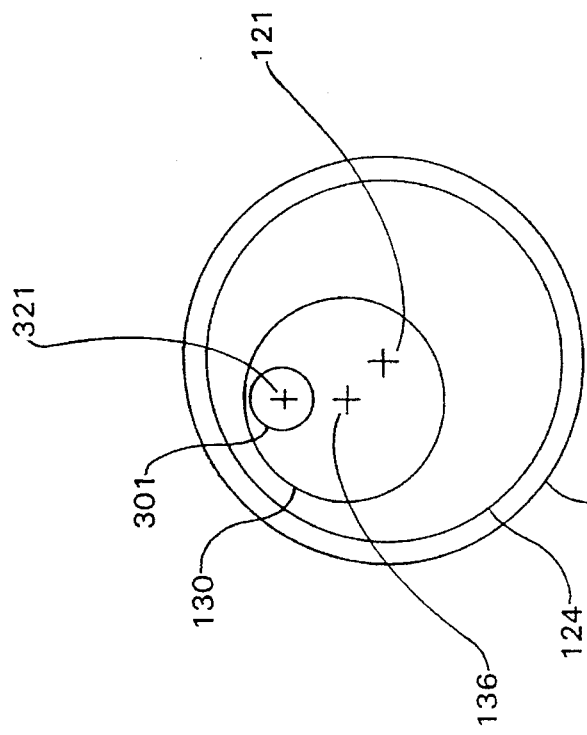

FIG. 4A is a exploded perspective view of the manipulator of FIG. 3 illustrating the relative positions of the stator 120, the outer element 124, the inner element 130 and the optional rod 301. FIG. 4B is a view of the internal end of the manipulator of FIG. 3 illustrating the relative positions of the stator 120, the outer element 124, the inner element 130 and the optional rod 301. The axis of the outer element 121, the inner element 136 and the axis of the rod (i.e., the object mounting site) 135 are indicated.

Manipulators of this invention provided with appropriate seals between the rotating inner and outer elements and the optional rotating rod can be readily adapted for manual operations and optionally provided with angular (for rotation) or linear (for translation) scales to allow selection of and accurate positioning of the object at a desired X-Y-Z coordinate within the chamber. These manipulators can also be readily adapted for motor driven operation using conventional means well-known in the art, for example using rack and pinion and/or worm gear drives attached to stepping motors. A motorized system for operation of the manipulator can be readily adapted again with techniques and procedures well-known in the art for computer-controlled positioning operation.

The manipulators of this invention can be adapted for external magnetic operation. For magnetic operation, the entire manipulator is enclosed in a sealed housing made of non-magnetic material adapted for mounting and sealing to a chamber and the manipulator elements are within the controlled chamber environment. In this case, it is not necessary to provide sealing means between the rotatable elements of the manipulator. However, it will be important to provide appropriate bearings or bushings to insure smooth rotation and relative motion of manipulator elements. Multiple, independent magnetic carriage units positioned outside of the housing are coupled with appropriately shaped magnet followers associated with each of the inner and outer elements and the optional rotatable rod of the manipulator. Independent rotation and/or linear motion of the external magnets allows independent rotation and/or linear motion of the internal manipulator elements. Art-known magnetic carriage/magnet follower configurations such as those described in U.S. Pat. No. 5,105,932 can be readily adapted or modified in view of other procedures, techniques and devices well-known in the art to provide for independent magnetic operation of the manipulator elements of this invention. Appropriate configurations must provide for independent motions of manipulator elements and for the eccentricity of the inner element with respect to the outer element. Magnetic rotation of one or more manipulator elements can also be readily combined with other external or internal means of providing for axial movement or rotation. For example, external magnetic rotation can be combined with axial translation conveyed via a high vacuum linear translation feed through device.

The manipulators of this invention can also be positioned entirely within the sealed chamber and provided with a conventional high vacuum linear translation feed through to provide axial motion of the inner element, for example. Rotary movement of the inner and outer elements and optional rod can then be achieved using, for example, piezoelectrically driven ratchet flexible drive through a mechanical feed through or small internal stepping motors (externally cooled, if necessary).

Figure 5A:
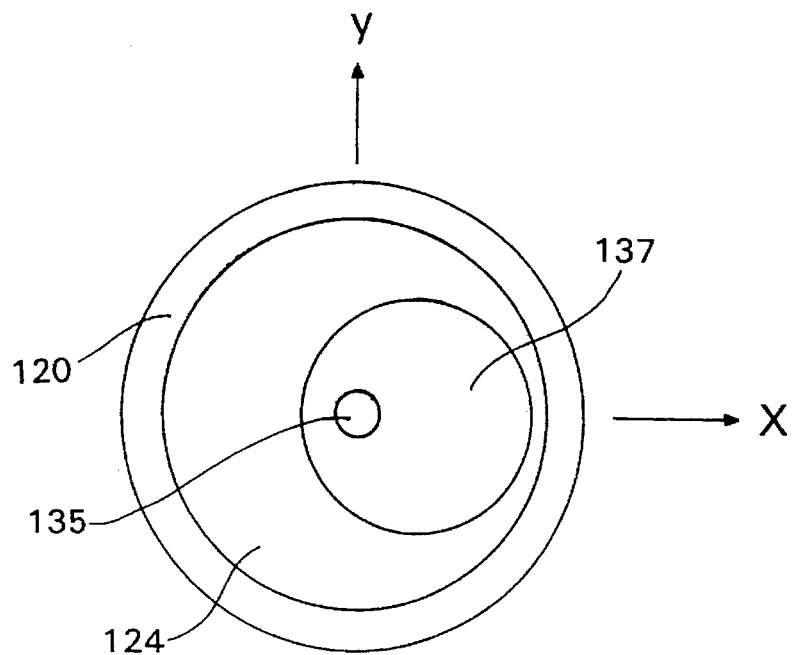
FIGS. 5A–5F illustrate translation of the relative rotation of the outer element and inner element of the manipulator of FIG. 1 into X-Y coordinate positions.
Figure 5B:
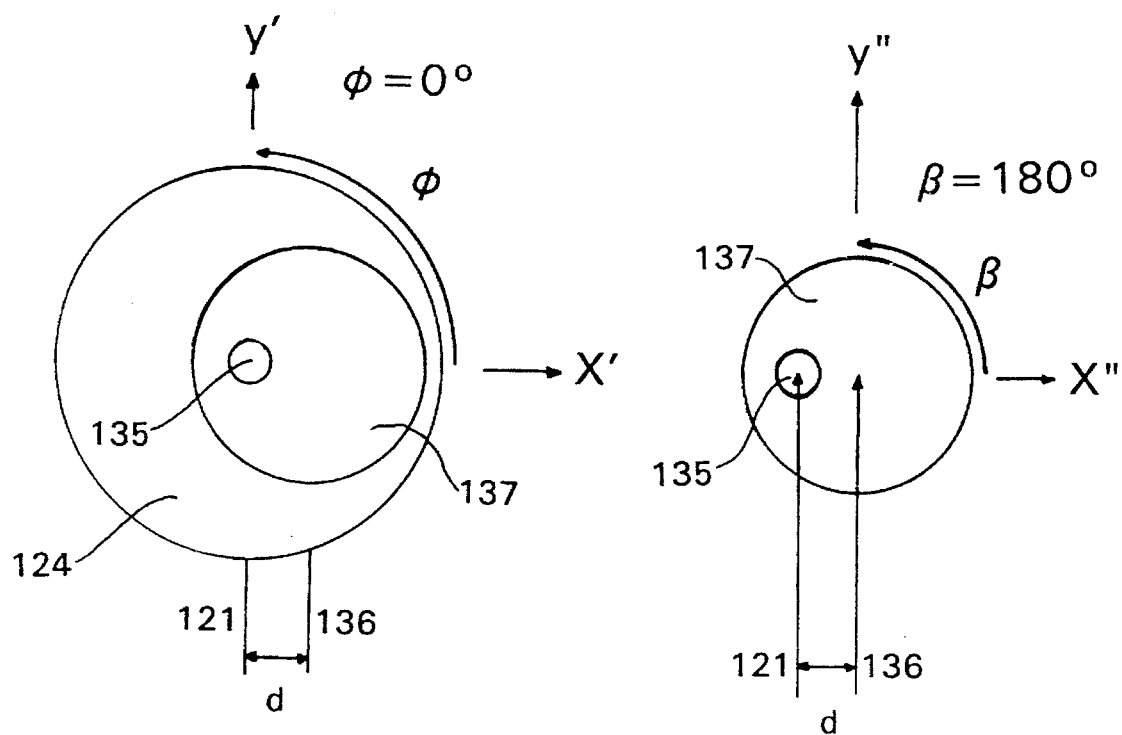

FIGS. 5A–5F illustrate the operation of the inventive manipulators for positioning of the object in an X-Y plane perpendicular to the axis of the manipulator. The Z axis for positioning of the object is along the manipulator axis and the Z coordinate is varied by linear axial motion of one of the elements, preferably of the inner element with respect to the outer element. The X and Y axes centered on the manipulator axis (also the axis of the outer element) are arbitrarily selected for reference in FIG. 5A. X and Y are the coordinates for the position of the object. X is a linear combination of the X coordinate contribution from rotation of the outer element (x') and inner element (x"). Thus, X=x'+x". Similarly, Y is a linear combination of the Y coordinate contributions from rotation of the outer (y') and inner (y") elements (i.e., Y=y'+y"). The x'/y' and x"/y" axes are shown in FIG. 5B. The x' and y' axes are centered on the axis of the outer element, collinear with the chosen X and Y reference axes, respectively. The x" and y" axes are centered on the axis of the inner element and are parallel to the chosen X and Y axes, respectively.

Angle $\phi$ measures rotation of the inner element with respect to the axis of the outer element and $\beta$ measures rotation of the object, i.e the object mounting site, with respect to the axis of the inner element. As shown in FIG. 5B, $\phi$ is the angle that a vector extending from the axis of the outer element to the axis of the inner element makes with the reference X axis. Angle $\beta$ is the angle that a vector extending from the axis of the inner element to the object mounting site makes with the X axis. In the chosen coordinate system:

$X=x'+x"$ $Y=y'+y"$ and $x'=d \cos\phi$ $y'=d \sin\phi$ $x"=d \cos\beta$ $y"=d \sin\beta$.

FIG. 5B illustrates the (X=0, Y=0) initial position. The inner element is rotated so that the object is coaxial with the outer element In this case, $\phi$ is 0°, $\beta$ is 180, x'=d, y'=0, x"=−d and y"=0, so that X=Y=0. When the inner element is in this position, rotation of the outer element rotates the object in place around the axis of the manipulator. Translation of the inner element with respect to the outer element, without rotation, allows the Z coordinate of the object to be changed. When the inner element is in this position, the manipulator can be employed to achieve uncoupled linear translation and rotation of an object, for example of a sample surface or a sputtering target, in the sealed chamber.

Figure 5C:
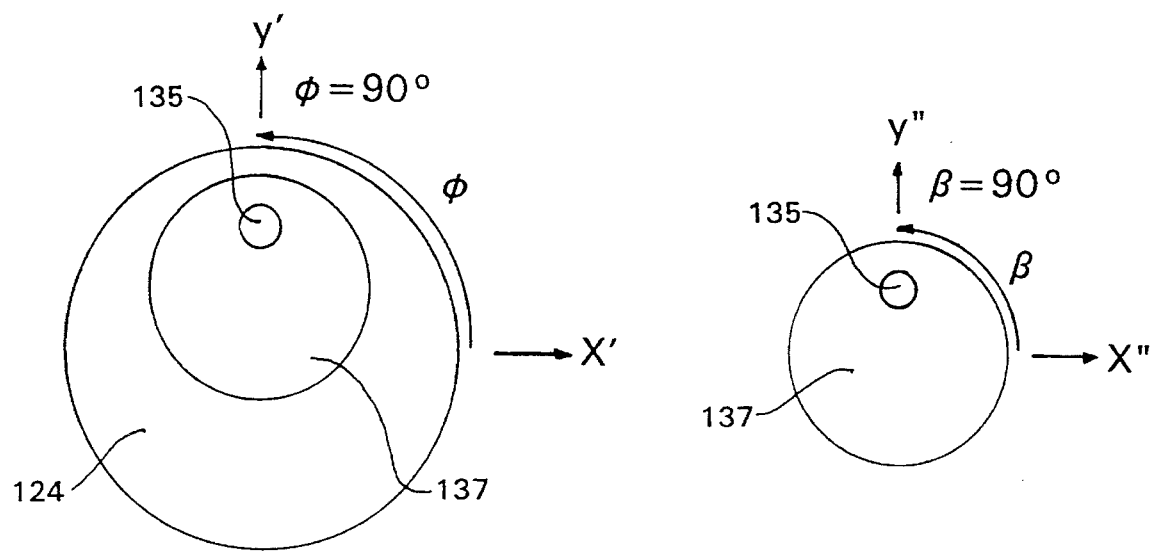
Figure 5D:
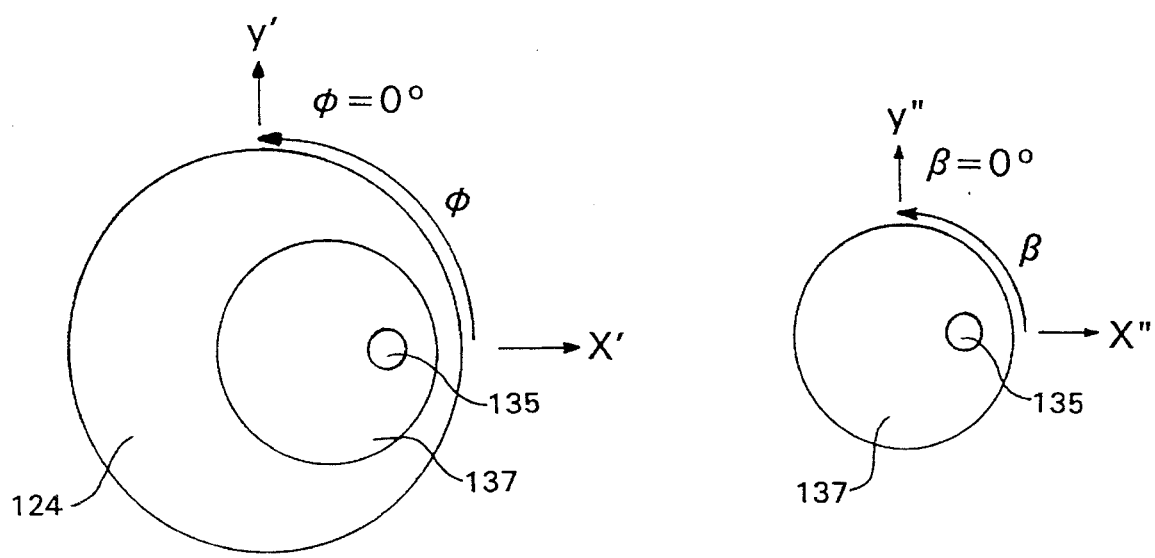

FIG. 5C illustrates a case with maximum Y travel. Here, both $\phi$ and $\beta$ are 90°. Applying the equations above, X=0 and Y=2d. FIG. 5D illustrates a case of maximum X travel with $\phi$ and $\beta$ both 0° and Y=0 and X=2d.

Figure 5E:
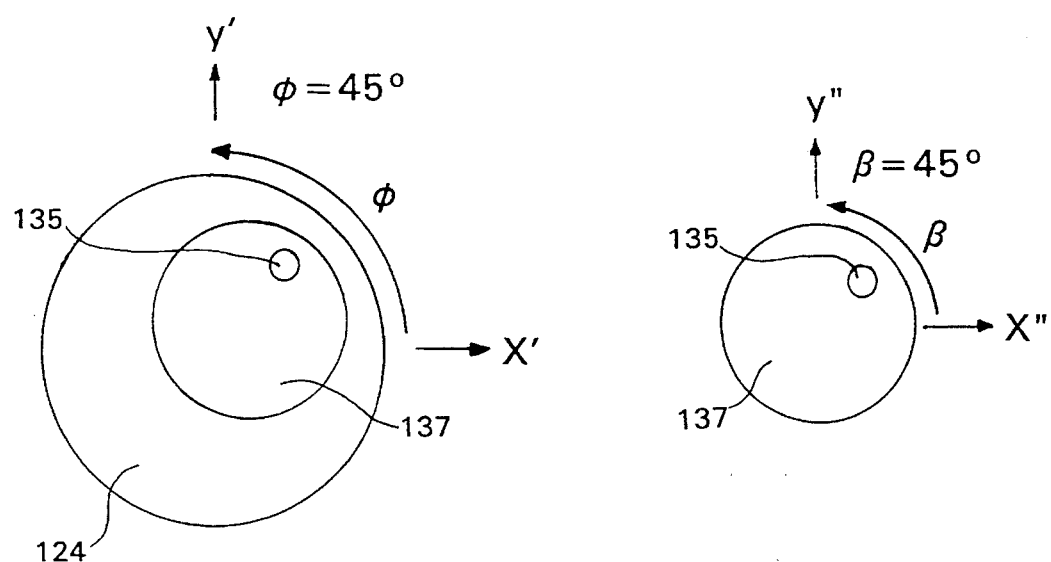

FIG. 5E illustrates an intermediate case. Here $\phi$ and $\beta$ are both 45°. Applying the equations above, Y=X=1.414 d.

Figure 5F:
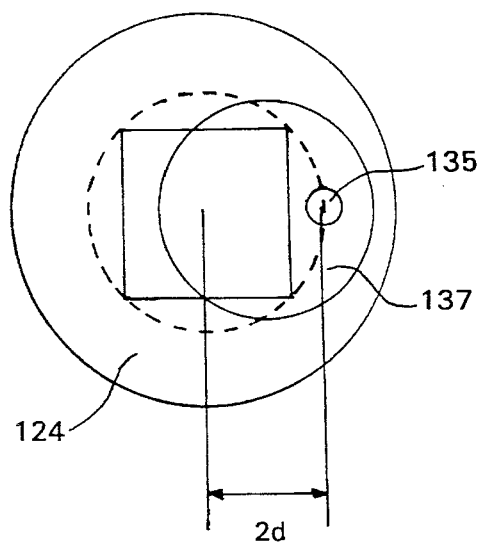

Thus, relative rotation of the inner and outer elements in a configuration like that in FIG. 1 allows positioning of the mounted object within a circle in the X-Y plane of radius 2d centered at the axis of the outer element. FIG. 5F illustrates the possible excursion of the center of the mounted object within the circle of radius 2d. The largest inscribed square within this circle has a side length of $4d/2^{1/2}$. Linear translation of the object then allows it to be positioning within a cylinder of radius 2d collinear with the outer element axis. To achieve this preferred mounting configuration, the diameter of the inner element must be at least equal to the radius of the outer element. Typically, to accommodate space for mounting and any spacing required between the inner and outer elements to accommodate seals, bushing, bearings or the like, the diameter of the inner element will be somewhat larger than the radius of the outer element, as indicated in FIGS. 5A–F.

Figure 6:
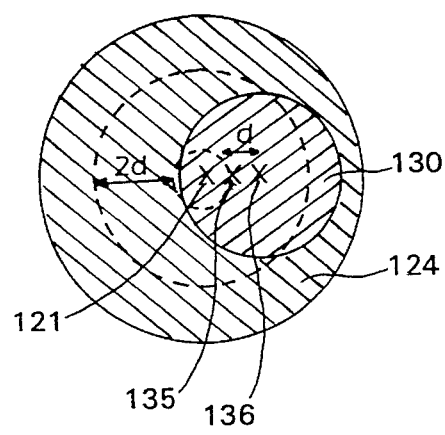
FIG. 6 illustrates an alternate off-axis and non-coaxial mounting position for the object on the inner element. In this case, the possible travel of the object is a ring of thickness 2d in the X-Y plane indicated by dashed lines.

Other configurations with alternate mounting positions of the object on the inner element end-face are within the scope of this invention although not preferred. For example, the object can be mounted off-axis at position 135 as in FIG. 6, i.e., so that it cannot be positioned coaxially with the outer element. In FIG. 6, the axes of the outer element (121) and the inner element (136) are shown. As indicated in FIG. 6, relative rotation of the inner and outer elements in this mounting configuration allows positioning of the object within a ring of thickness 2d around the outer element axis, shown as dashed lines. As will be apparent to those of ordinary skill in the art, this ring positioning pattern can also be achieved by sizing the diameter of the inner element to be less than the radius of the outer element.

FIGS. 7A–C illustrate an alternate configuration of inner and outer elements with increased potential X and Y travel of the object compared to that of the manipulator of FIG. 1. FIG. 7A is a cross-sectional view of alternate outer and inner elements of the manipulator. The inner element 730 is composed of two portions, a head 705 and a shaft portion 706. The outer element 124 is essentially the same as in other manipulator configurations of this invention having an eccentrically bored passageway for receiving the rotatable shaft of the inner element. The head portion, shown as a cylinder with larger diameter than the shaft, extends into the sealed chamber (not shown). The head has end-face 137 upon which the object to be positioned is mounted at 135. A nozzle (720) schematically is illustrated in place on the end face mounted at 135. The preferred mounting position is such that the object can be rotated to a position coaxial with the outer element. The shaft of the inner element is rotatable with respect to the outer element and can also be moved linearly in and out with respect to the outer element. As with the manipulator of FIG. 1, the outer element is also rotatable with respect to a stator adapted for mounting onto a sealed atmosphere chamber (not shown). If necessary, the stator, outer and inner element can be provided with means for creating a seal (not shown), as exemplified in FIGS. 1 and 3, to retain the integrity of the sealed chamber. Preferably, the interfaces between the shaft and the outer element and stator and the outer element are provided with bushings or ball bearings to provide for ease of relative rotation and/or linear motion.

FIGS. 7B and C are approximately one-half scale views of the end face of the manipulator configuration of FIG. 7A illustrating the potential travel of the object mounted at 135. FIG. 7B shows the X=Y=0 initial position with the object aligned coaxially with the outer element. FIG. 7C shows a maximum outward position of the object extending beyond the diameter of the outer element. The object can be positioned within a circle of diameter 139 X-Y plane. The radius of potential object travel is twice the distance (d, 601) between the mounting site 135 and the axis of the inner element 621.

The manipulator of FIG. 7A illustrates a passageway (631) extending through the shaft exiting at the mounting site (135) at the head. This feature can be employed, for example, to deliver gases or liquids, cooling water, power or the like to the object or into the sealed chamber at a desired location. Any of the manipulators of this invention can be provided with such a passageway. Appropriate connections and seals may be required to accomplished delivery into the chamber to avoid compromising the internal atmosphere of the chamber. Such connections and seals are well-known in the art and can be readily adapted to this application.

Although this invention has been described and illustrated by use of specific embodiments, it will be appreciated by those skilled in the art that functional equivalents of specific features and details described and variants of these specific embodiments exist and can be readily and routinely adapted for use in this invention without departing from the spirit and scope thereof. This invention encompassed all such equivalents and variants.

We claim:

1. An apparatus for positioning an object within a sealed chamber which comprises:

an inner rotatable element having an internal end face;

an outer substantially cylindrical rotatable element also having an internal end face and having an eccentrically bored longitudinal passage sized and shaped for receiving said inner element; said inner and outer rotatable elements being independently rotatable with respect to each other; and a stator sized and shaped for receiving said outer rotatable element wherein said apparatus is adapted for mounting on said chamber such that the end faces of said inner and outer elements communicate with the inside of said chamber and wherein said apparatus is adapted for forming a seal with said chamber to isolate said chamber from the external atmosphere.

2. The apparatus of claim 1 wherein said inner element can also be linearly translated with respect to said outer element within said passage.

3. The apparatus of claim 1 wherein said internal end face of said inner element is adapted for mounting said object at a point such that said mounted object can be moved by rotation of said inner element to be coaxial with said outer element.

4. The apparatus of claim 1 further comprising a rotatable rod adapted for coaxial mounting of said object wherein said inner element has an eccentrically bored passage sized and shaped for receiving said rotatable rod.

5. The apparatus of claim 4 in which said eccentric passage in the inner element is positioned such that said rod-mounted object can be moved by rotation of said inner element to be coaxial with said outer element.

6. The apparatus of claim 1 further comprising a means for forming a seal between the apparatus and said chamber to isolate the chamber from the external atmosphere wherein said seal comprises a seal at the interface between said inner and outer elements and a seal at the interface between said stator and outer element.

7. The apparatus of claim 6 wherein said interface seals are made by o-rings in o-ring grooves around the circumference of the inner and outer elements.

8. The apparatus of claim 1 further comprising bearing and or bushing means positioned for facilitating rotation, linear translation or both of said inner and outer elements.

9. The apparatus of claim 1 wherein said inner element comprises two portions: a rotatable cylindrical shaft positioned and rotatable within the eccentric passage of said outer element and a head portion upon which said object is mounted, said outer element passage offset from the axis of said outer element by more than one-half the radius of the outer element and said head sized and shaped such that said mounted object on rotation of said inner element can be positioned at a distance radially outward from the outer element axis greater than the radius of the outer element.

10. The apparatus of claim 1 wherein said inner element has a passage for delivery of gases or liquids to the sealed chamber.

11. The apparatus of claim 1 further comprising an object.

12. The apparatus of claim 1 wherein said object is a nozzle.

13. The apparatus of claim 11 wherein said object is a sample holder.

14. The apparatus of claim 1 adaptable for external manual operation.

15. The apparatus of claim 1 adaptable for external motor-driven operation.

16. The apparatus of claim 1 adaptable for internal motor-driven operation.

17. The apparatus of claim 1 adaptable for magnetic operation by means of external magnetic carriages.

\* \* \* \* \*

UNITED STATES PATENT AND TRADEMARK OFFICE
CERTIFICATE OF CORRECTION

PATENT NO. : 5,575,176

DATED : November 19, 1996

INVENTOR(S) : Rohrs et al.

It is certified that error appears in the above-identified patent and that said Letters Patent is hereby corrected as shown below:

At column 10, line 20, "and or" should read --and/or--.

At column 10, line 36, (claim 12), "claim 1" should read --claim 11--.

Signed and Sealed this

Eleventh Day of February, 1997

Attest:

BRUCE LEHMAN

Attesting Officer

Commissioner of Patents and Trademarks